(12) United States Patent
Fujisawa et al.

(10) Patent No.: US 7,259,085 B2
(45) Date of Patent: Aug. 21, 2007

(54) METHOD FOR FORMING THIN FILM, SUBSTRATE HAVING THIN FILM FORMED BY THE METHOD, AND PHOTOELECTRIC CONVERSION DEVICE USING THE SUBSTRATE

(75) Inventors: Akira Fujisawa, Osaka (JP); Daisuke Arai, Osaka (JP); Kiyotaka Ichiki, Osaka (JP); Yukio Sueyoshi, Osaka (JP); Toru Yamamoto, Osaka (JP); Tsuyoshi Otani, Osaka (JP)

(73) Assignee: Nippon Sheet Glass Company, Limited, Tokyo (JP)

( * ) Notice: Subject to any disclaimer, the term of this patent is extended or adjusted under 35 U.S.C. 154(b) by 147 days.

(21) Appl. No.: 10/496,487

(22) PCT Filed: Dec. 3, 2002

(86) PCT No.: PCT/JP02/12683

§ 371 (c)(1),
(2), (4) Date: Jan. 10, 2005

(87) PCT Pub. No.: WO03/050324

PCT Pub. Date: Jun. 19, 2003

(65) Prior Publication Data

US 2005/0130416 A1  Jun. 16, 2005

(30) Foreign Application Priority Data

Dec. 3, 2001 (JP) ............................. 2001-368352
Dec. 3, 2001 (JP) ............................. 2001-368662

(51) Int. Cl.
*H01L 21/443* (2006.01)
*C23C 16/40* (2006.01)

(52) U.S. Cl. ............ 438/608; 427/255.19; 427/255.35; 427/255.36

(58) Field of Classification Search ........... 427/255.15, 427/255.19, 255.31, 255.32, 255.33, 255.34, 427/255.35, 255.36; 438/608, 609
See application file for complete search history.

(56) References Cited

U.S. PATENT DOCUMENTS 3,944,684 A * 3/1976 Kane et al. ................. 427/109

(Continued)

FOREIGN PATENT DOCUMENTS

EP    0 755 902 A2    1/1997

(Continued)

*Primary Examiner*—M. Wilczewski
(74) *Attorney, Agent, or Firm*—Hamre, Schumann, Mueller & Larson, P.C.

(57) ABSTRACT

The present invention provides a method of forming a thin film containing a metal oxide as the main component, the film thickness of which is relatively uniform, at a high film deposition rate over a wide area and over a long time. The present invention is a method for forming a thin film containing a metal oxide as the main component on a substrate using a mixed gas stream containing a metal chloride, an oxidizing material, and hydrogen chloride, by a thermal decomposition method at a film deposition rate of 4500 nm/min. or greater, performing at least one selected from: 1) prior to mixing the metal chloride and the oxidizing material in the mixed gas stream, contacting hydrogen chloride with at least one selected from the metal chloride and the oxidizing material, and 2) forming a buffer layer in advance on a surface of the substrate on which the thin film containing a metal oxide as the main component is to be formed.

7 Claims, 2 Drawing Sheets

U.S. PATENT DOCUMENTS

| | | |
|---|---|---|
| 4,853,257 A | 8/1989 | Henery |
| 5,041,150 A | 8/1991 | Grundy et al. |
| 5,871,811 A * | 2/1999 | Wang et al. .............. 427/248.1 |
| 6,133,159 A * | 10/2000 | Vaartstra et al. ............ 438/758 |
| 6,362,414 B1 | 3/2002 | Fujisawa et al. |
| 2004/0224504 A1* | 11/2004 | Gadgil ....................... 438/680 |

FOREIGN PATENT DOCUMENTS

| | | |
|---|---|---|
| EP | 1 054 454 A2 | 11/2000 |
| JP | 2-175631 | 7/1990 |
| JP | 6-47482 | 6/1994 |
| JP | 9-40442 | 2/1997 |
| JP | 11-180734 | 7/1999 |
| JP | 11-509895 | 8/1999 |
| JP | 2001-15783 | 1/2001 |
| WO | 97/42357 | 11/1997 |

* cited by examiner

METHOD FOR FORMING THIN FILM, SUBSTRATE HAVING THIN FILM FORMED BY THE METHOD, AND PHOTOELECTRIC CONVERSION DEVICE USING THE SUBSTRATE

TECHNICAL FIELD

This invention relates to a method of forming, on a surface of a glass sheet or the like, a thin film containing a metal oxide as the main component using a thermal decomposition method. The invention also relates to a substrate provided with the thin film formed by this method. The invention further relates to a photoelectric conversion device using the substrate provided with the thin film.

BACKGROUND ART

A thin film containing a metal oxide such as tin oxide has the function of reflecting infrared rays. Since a glass sheet provided with this thin film reduces the total solar energy transmittance and does not allow the heat within rooms to escape to the outdoors, it is widely available in the market as a low-emissivity glass. This thin film also can exhibit the function of shielding electromagnetic waves. A known method for manufacturing a glass sheet of this kind is such that a thin film of a metallic compound is formed on a high temperature glass surface utilizing thermal decomposition methods, such as a chemical vapor deposition method (CVD method) and a spraying method in which a solution material or a solid material is sprayed. For example, JP 11(1999)-509895 A describes a method of forming a thin film of a tin oxide by supplying a gaseous reaction mixture containing an organic tin compound, hydrogen fluoride, oxygen, and water onto a high temperature glass surface. JP 6(1994)-47482 A describes a method of forming a thin film of tin oxide by supplying a vapor of an organic tin compound on a glass ribbon surface in a float bath in a float manufacturing process. The use of the organic tin compounds such as described in these patent publications as a raw material for a thin film has an advantage that the thickness of the thin film easily is made uniform. Nevertheless, because organic tin compounds have high environmental loads as with tributyltin compounds, the use of alternative raw materials that replace organic tin compounds has been desired in recent years. Meanwhile, tin chloride conventionally has been used widely as a raw material for a tin oxide thin film in thermal decomposition methods. For example, JP 2(1990)-175631 A describes a method of forming a coating film in which, with a CVD method, a first flow of tin tetrachloride and a second flow of water vapor are supplied onto a glass in a turbulent flow state. Also, JP 9(1997)-40442 A describes a chemical vapor deposition method of forming a tin oxide on a glass of a substrate by causing tin tetrachloride and water to react with each other, wherein tin tetrachloride and water are supplied by separate flows at temperatures in a range of 100° C. to 240° C. and a single flow is formed and directed to the substrate substantially with a laminar flow to cause them to react with each other in a substrate region, whereby the glass is coated.

Such methods of forming a thin film containing a metal oxide that utilize thermal decomposition methods are inferior to physical vapor deposition methods, such as a sputtering method, in that it is difficult to obtain a uniform film thickness; nevertheless, they are capable of forming a thin film over a wide area within a short time at a relatively uniform thickness and therefore are suitable for mass production of industrial products. With the thermal decomposition methods, generally, the higher the temperature of the reaction system is, the faster the film deposition rate, although the situations vary somewhat depending on the compositional components of the raw materials for the thin film or the like. Accordingly, it seems that higher temperatures are preferable for the formation of a thin film in industrial production processes.

In the above-described thermal decomposition methods, the use of alternative raw materials has been desired because organic tin compounds have large environmental loads. The present inventors carried out a further experiment on the method described in JP 2(1990)-175631 A, which uses tin tetrachloride, an inorganic tin compound, and as a result found that when a first flow of tin tetrachloride and a second flow of water vapor are separately supplied to react with each other on a substrate, or when a reaction gas stream is supplied with a turbulent flow, non-uniformity in film thickness is caused in the formed thin film. The present inventors also performed a further experiment on the method described in JP 9(1997)-40442 A, in which tin tetrachloride and water are mixed and supplied onto a glass substrate with a laminar flow. It was confirmed that it was true that performing a coating according to this method eliminates non-uniformity in film thickness. However, due to high reactivity of tin tetrachloride with water, even when a pipe or the like for the mixed gas was controlled at a temperature of 100° C. to 240° C. as described in JP 9(1997)-40442 A, the pipe was clogged up by the reactant that deposited inside the pipe after only about 3 hour's supplying of a mixed gas of tin tetrachloride and water, making further gas supply impossible. Then, hydrogen chloride was further added to the mixed gas of tin tetrachloride and water vapor, and the mixed gas was supplied, as described likewise in Example D of JP 9(1997)-40442 A. In this case, hydrogen chloride acted as a reaction inhibitor, so the pipe was not clogged up in a short time. Nevertheless, although the clogging of pipe did not occur when hydrogen chloride and tin tetrachloride were supplied at a mole ratio of 1:1 as in Example D of JP 9(1997)-40442 A, the film deposition rate considerably lowered to about ⅓ of that in the case in which hydrogen chloride is not mixed because hydrogen chloride served as a reaction inhibitor.

DISCLOSURE OF THE INVENTION

This invention has been accomplished in view of the foregoing problems. Its object is to provide a method of forming a thin film containing a metal oxide as the main component having a relatively uniform film thickness over a wide area and a long time at a high film deposition rate, by utilizing a thermal decomposition method using an inorganic metal chloride, which has a low environmental load, as a raw material. Another object is to provide a substrate having this thin film, and to provide a photoelectric conversion device utilizing this substrate.

In order to accomplish the foregoing objects, a thin film-forming method according to this invention is a method of forming a thin film containing a metal oxide as a main component on a substrate using a mixed gas stream containing a metal chloride, an oxidizing material, and hydrogen chloride by a thermal decomposition method at a film deposition rate of 4500 nm/min. or greater, characterized by performing at least one of the following 1) and 2).

1) Prior to mixing the metal chloride and the oxidizing material in the mixed gas stream, the hydrogen chloride is brought into contact with at least one selected from the metal chloride and the oxidizing material.

2) A buffer layer is formed in advance on a surface of the substrate on which the thin film containing a metal oxide as the main component is to be formed.

With this method, a thin film containing a metal oxide as the main component can be formed over a large area and a long time at a high film deposition rate in a stable manner by a thermal decomposition method. Moreover, because a substrate according to this invention is provided with a thin film containing a metal oxide as the main component in which the film thickness is uniform and the surface unevenness is relatively large, its resistivity is low, and it is unlikely to cause problems in its appearance such as white turbidity.

In 1) of the method of the present invention, it is sufficient that before the metal chloride and the oxidizing material mix with each other in the mixed gas stream, hydrogen chloride contacts at least one selected from the metal chloride and the oxidizing material; for example, the metal chloride and the oxidizing material may be successively or simultaneously added to a gas stream containing hydrogen chloride to form the mixed gas stream, or for example, hydrogen chloride may be added in advance to both or either one of the metal chloride and the oxidizing material.

Furthermore, since a photoelectric conversion device according to this invention is provided with the substrate having the above-noted characteristics, it has advantages such as it is unlikely to cause defects such as pinholes in the photoelectric conversion layer and the photoelectric conversion efficiency is high.

PREFERRED EMBODIMENTS OF THE INVENTION

Hereinbelow, preferred embodiments of this invention are described in detail. It should be noted that the invention is not intended to be limited by the following preferred embodiments.

This invention is characterized by a method of forming a thin film containing a metal oxide as the main component on a substrate using a thermal decomposition method, which forms the thin film containing a metal oxide as the main component at a high film deposition rate while suppressing pipe clogging due to the reaction of a mixed gas of a metal chloride and an oxidizing material. Herein, the term "thin film containing a metal oxide as the main component" is intended to mean a thin film that contains a metal oxide such as tin oxide, titanium oxide, or silicon oxide, as its main component. The term "main component" denotes, according to convention, that the content of a compositional component is 50 wt. % or greater. The characteristics of a thin film are mostly determined by its main component, and therefore, it will be appropriate to assess the characteristics of the thin film with the main component.

The present inventors have conducted intensive studies on a method for forming a thin film containing a metal oxide as the main component by a thermal decomposition method stably over a large area and a long time at a high film deposition rate, 4500 nm/min. or greater, and as a result have found that if, before mixing a metal chloride and an oxidizing material in a gas stream transferring raw materials onto a substrate, hydrogen chloride is added to the gas stream at an appropriate amount, or if the surface of a substrate on which the thin film is to be formed is made into a shape such that crystal growth takes place easily, the thin film containing a metal oxide as the main component is made to have a uniform film thickness and a relatively large surface roughness. By permitting hydrogen chloride to be present in advance in a gas stream before mixing a metal chloride and an oxidizing material in this way, the function of suppressing the reaction between the metal chloride and the oxidizing material is enhanced, so even if the concentration of hydrogen chloride in the gas stream is kept low, the above-noted reaction effectively can be suppressed until the gas stream reaches the substrate. It is desirable that, before the metal chloride and the oxidizing material are mixed together, hydrogen chloride be mixed with either of the raw materials. Also, by controlling the surface shape of the substrate on which the thin film containing a metal oxide as the main component is to be formed, the crystal growth of the metal oxide can be allowed to start from numerous points, and variation in film thickness can be suppressed even if the film deposition rate is made faster.

When the mole ratio of hydrogen chloride to the metal chloride is high in the mixed gas stream, clogging of the pipe through which the mixed gas passes does not easily occur, but additionally, the reaction between the metal chloride and the oxidizing material itself is suppressed; consequently, the film deposition rate for the thin film containing a metal oxide as the main component considerably decreases, or the thin film does not form finely. In view of this, it has been found that when the proportion of hydrogen chloride to the metal chloride is reduced to less than 1 in mole ratio, the thin film can be formed without clogging the pipe at a high film deposition rate of 4500 nm/min. or greater or even at 6300 nm/min. or greater even if the mixed gas containing the metal chloride and an oxidizing material is supplied to form a thin film continuously for a long time. In particular, it was found that setting the mole ratio of hydrogen chloride to a metal chloride to be 0.2 or less is more effective.

The thin film containing a metal oxide as the main component may be formed directly on the substrate, or alternatively, it may be formed on an undercoating film provided on the substrate. When a buffer layer that contains a large quantity of what can serve as the starting points for crystal growth of the metal oxide is allowed to exist on the substrate in advance before the formation of the thin film containing a metal oxide as the main component, it is possible to suppress variation in the crystal growth over the entire thin film and to make the film thickness uniform and the surface roughness relatively large.

This "buffer layer" denotes those in which fine metallic particles are adhered to a substrate, or a thin film that is formed at a slower film deposition rate than the film deposition rate for the thin film containing a metal oxide as the main component. Generally, in thermal decomposition methods, the formation of the thin film virtually denotes crystal growth in the case where the metal oxide is crystalline; therefore, the conditions of the crystal growth in the thin film change considerably depending on the conditions of the surface of the substrate or the like on which the thin film is formed. Specifically, if what serves as starting points for crystal growth exist in large numbers on the surface of a substrate on which the thin film is formed, crystal growth starts from numerous points, and consequently, the crystal growth, that is, the thickness of the thin film, becomes relatively uniform. On the other hand, if what serves as starting points for the crystal growth exist in fewer numbers on that surface, each one of the crystals grows large before the formation of crystal nuclei in the case of a raw material with faster reactivity being used, and variation in film thickness therefore becomes large. Moreover, crystals become more difficult to grow, slowing down the film deposition rate. In turn, if the formation temperature of the thin film is increased to complement the slowing down of the film deposition rate, the variation in film thickness becomes even larger. In view of this, by providing the buffer layer on the substrate in advance, the crystal growth can be started from numerous points in the thin film having a metal oxide as the main component and the film thickness of the thin film having a metal oxide as the main component can be made uniform even at a high film deposition rate.

For the fine metallic particles that constitute the buffer layer, it is preferable that their average particle diameter be 5 to 500 nm in order that they function as nuclei for crystal growth and suppress the formation of giant crystal grains at the same time in the formation of the thin film containing a metal oxide as the main component. The method for providing the fine metallic particles on the substrate is not particularly limited, but a preferable method is such that they are fixed to a substrate heated at a high temperature by a powder spraying method, in order that they can be disposed uniformly over the substrate and not be overlaid. It is desirable that the fine metallic particles form a single layer and have a closest packed structure on a substrate; however, there may be slight gaps between the particles because it is sufficient as long as they function as the nuclei for crystal growth. When the gap between the particles is 100 µm or less, the particles can contribute to uniformity in the thin film containing a metal oxide as the main component.

Because the thin film that constitutes the buffer layer needs to function as starting points for crystal growth in the thin film containing a metal oxide as the main component, it is necessary that the film be formed uniformly on the surface of the substrate or of the undercoating film, desirably with bumps at constant intervals on the surface. For that reason, the film deposition rate for this thin film is slower than the film deposition rate for the thin film containing a metal oxide as the main component. Even if the film deposition rate for this thin film itself is slow, the thickness thereof is, as will be described later, significantly thinner than that of the thin film containing a metal oxide as the main component; therefore, the film deposition rate as a whole, which includes that for the thin film containing a metal oxide as the main component, does not degrade considerably. Rather, because of the presence of this thin film, the film deposition rate for the thin film containing a metal oxide as the main component can be made faster; therefore, if the buffer layer is formed to be relatively thin and in addition the thin film containing a metal oxide as the main component is formed more quickly at a higher temperature, the film deposition rate as a whole can be made faster.

Because of the presence of the buffer layer, the starting points for crystal growth of metal oxide increase greatly in number and the crystal growth starts almost simultaneously from numerous positions; therefore, the generation of giant crystal grains is suppressed, and as a result, the thickness of the thin film containing a metal oxide as the main component becomes relatively uniform. When the buffer layer is the same type of thin film as the thin film containing a metal oxide as the main component, a high film deposition rate can be maintained while preventing clogging of a pipe by making a mixture so that the mole ratio of hydrogen chloride to a metal chloride in the mixed gas stream is less than 1 in the formation of the buffer layer as well.

The undercoating film serves to prevent, for example, when the substrate is glass, an alkaline component contained in the glass from thermally diffusing in the buffer layer or the thin film containing a metal as the main component, and examples include thin films containing silicon oxide, aluminum oxide, silicon oxynitride, silicon oxycarbide, or the like as the main component. Alternatively, when the bond strength between the substrate and either the buffer layer or the thin film containing a metal oxide as the main component is low, it may be such a thin film that contains both of the components of the substrate and either the buffer layer or the thin film containing a metal oxide as the main component. Because of the presence of the undercoating layer, the buffer layer or the thin film containing a metal oxide as the main component can be bonded to the substrate at a sufficient strength, and its characteristics do not easily degrade. Further, the undercoating film may be a single layer, or may be made up of two layers. For example, in cases where the undercoating film is made up of two layers, if a thin film having a thickness of 20 to 100 nm and containing tin oxide or titanium oxide as the main component is used for a first undercoating layer that is nearer the substrate whereas a thin film having about the same thickness and containing silicon oxide or aluminum oxide as the main component is used for a second undercoating layer, interference colors originating from the thin film containing a metal oxide as the main component can be reduced.

In particular, when the undercoating film includes two layers, the formation of a thin film containing a metal oxide such as tin oxide or titanium oxide as the main component for the first undercoating layer makes it possible to increase the film deposition rate for the thin film containing a metal oxide as the main component that is directly formed on the second undercoating layer, or to increase the film thickness of the thin film containing a metal oxide as the main component without causing a white turbidity condition. The thin film containing a metal oxide such as tin oxide or titanium oxide as the main component that is used for the first undercoating layer is crystalline, even though it is a very thin film, and a surface roughness originating from crystal grains is formed on the surface thereof. This surface roughness is reflected in the surface of the non-crystalline second undercoating layer, such as silicon oxide or aluminum oxide. For this reason, if the undercoating film is only a non-crystalline undercoating film, such as silicon oxide, the surface becomes completely flat, but since the surface roughness is formed on the surface of the undercoating film, the surface roughness serves to function as starting points for growing the buffer layer or the thin film containing a metal oxide as the main component, exhibiting various similar advantageous effects to those of the above-described buffer layer.

On the other hand, even if the substrate was glass, the undercoating film is not necessarily required when the substrate is aluminosilicate glass, borosilicate glass, quartz glass, or the like, which does not contain alkaline components. Nevertheless, there are cases in which the undercoating film is necessary for other purposes than preventing an alkaline component from diffusing, and it should not be interpreted as excluding the provision of the undercoating film on a glass that does not contain alkaline components.

Those glasses that do not contain alkaline components have higher thermal characteristics, such as glass transition temperature, than a soda lime glass, which contains an alkaline component, and therefore, they are capable of forming a thin film containing a metal oxide as the main component at higher temperatures.

The metal that constitutes the buffer layer may be a different type of metal from the metal of the thin film containing a crystalline metal oxide as the main component, but it is preferable that they are the same type of metal. When they are the same type of metal, crystal growth is induced more in the thin film containing a metal oxide as the main component, and therefore, the fine metallic particles can be made small in particle diameter or less in number, or the content of the metal can be reduced in the buffer layer. For example, when a thin film made of tin oxide or titanium oxide that has a rutile structure is formed as the buffer layer, it is desirable to form a film composed of tin oxide or titanium oxide with the same rutile structure, or a film composed of titanium oxide with an anatase structure, which is very similar to the rutile structure, as the thin film containing a metal oxide as the main component.

The method for forming the thin film containing a metal oxide as the main component is not particularly limited as long as it is a thermal decomposition method, and examples include a CVD method and a solution-spraying method in which a solution material is sprayed onto a heated substrate. If the buffer layer and the thin film containing a metal oxide as the main component are formed by the same formation method, they can be formed within a short time by a series of manufacturing steps; for this reason, it is preferable that these be formed by the same method in terms of industrial production efficiency. An example is a method in which, after forming the buffer layer using a CVD method, the thin film containing a metal oxide as the main component is successively formed. In this case, however, the formation temperature for the thin film containing a metal oxide as the main component becomes lower than that in the formation of the buffer layer, and therefore, it is desirable to utilize a material with good reactivity, such as a tetrachloride, for the raw material of the thin film containing a metal oxide as the main component.

Preferable materials for the thin film containing a metal oxide as the main component are chlorides of metals that do not contain organic substances, such as tin dichloride, tin tetrachloride, titanium chloride, zinc chloride, and indium chloride, which are chemically stable and have low environmental load, and tetrachloride of metal is especially suitable to increase the film deposition rate.

When the concentration of the metal in a gas flow containing the raw material was lowered, it was confirmed that in the case of forming the thin film that constitutes the buffer layer by a CVD method, the film deposition rate for the buffer layer could be made faster and moreover white turbidity was not caused even with the buffer layer having an increased film thickness. It is inferred that this is because the lowering of the concentration of the metal in the gas flow suppressed an abrupt crystal growth that originates from the high concentration metal residing locally.

The thin film that constitutes the buffer layer should preferably be in a condition such that the thickness is 10 to 250 nm and the surface thereof has a multiplicity of bumps having a height of 10 to 200 nm. When the thickness is less than 10 nm, there is a risk of the undercoating film being not completely covered; on the other hand, when exceeding 250 nm, the bumps become too large and too high, increasing the risk of generating giant crystal grains in the thin film containing a metal oxide as the main component. The more preferable thickness of this thin film is 30 to 200 nm.

The metal chloride that is a raw material for the thin film containing a metal oxide as the main component preferably should be in a gaseous state in the vicinity of the substrate. Accordingly, it may be in a liquid state on the way in which it is supplied to the vicinity of the substrate. That is, it is possible to employ either a solution-spraying method, in which the gas stream containing the metal chloride is liquid on the way, or a powder spraying method, in which it is in a solid state.

With a thin film-forming method according to the this invention, the pipe through which the mixed gas stream passes is not clogged up even if the thin film containing a metal oxide as the main component is continuously formed at a film deposition rate of 4500 nm/min. or greater. In particular, in the method in which the undercoating film, the thin film that constitutes a buffer layer, and the thin film containing a metal oxide as the main component are formed in that order in a float bath by a CVD method using a glass ribbon as a substrate (hereafter referred to as a "online CVD method"), the temperature of the reaction system in the formation of the thin film containing a metal oxide as the main component (the surface temperature of the glass ribbon immediately therebefore) can be elevated to 615° C. or higher, or even to a range of 620° C. to 750° C., and when the above-noted surface temperature is 650° C. or higher, the film deposition rate reaches as high as 6300 to 20000 nm/min.

As the chlorides of metals that are raw materials for the thin film that constitutes the buffer layer or the thin film containing a metal oxide as the main component, chlorides of tin and chlorides of titanium are preferable. Examples of tin materials include tin tetrachloride, dimethyltin dichloride, dibutyltin dichloride, tetramethyltin, tetrabutyltin, dioctyltin dichloride, monobutyltin trichloride, and dibutyltin diacetate, and tin tetrachloride is particularly suitable. Examples of titanium material include titanium tetrachloride, titanium isopropoxide, and the like.

In addition, examples of the oxidizing material that reacts with the above-noted metal chloride and that constitutes the thin film containing a metal oxide as the main component include oxygen, water vapor, and dry air.

Further, when a thin film having tin oxide as the main component is formed as the thin film containing a metal oxide as the main component, it is possible to add chemical compounds of antimony or fluorine in the mixed gas stream in order to improve its conductivity. Examples of the chemical compound of antimony include antimony trichloride and antimony pentachloride, and examples of the fluorine compound include hydrogen fluoride, trifluoroacetic acid, bromotrifluoromethane, and chlorodifluoromethane.

In the case of forming the undercoating film by a thermal decomposition method, examples of raw materials for silicon oxide suitable as the undercoating film include monosilane, disilane, trisilane, monochlorosilane, dichlorosilane, 1,2-dimethylsilane, 1,1,2-trimethyldisilane, 1,1,2,2-tetramethyldisilane, tetramethyl orthosilicate, and tetraethyl orthosilicate. Examples of the oxidizing materials in this case include oxygen, water vapor, dry air, carbon dioxide, carbon monoxide, nitrogen dioxide, and ozone. It should be noted that in the case of using silane, an unsaturated hydrocarbon gas, such as ethylene, acetylene, or toluene, may be used in combination for the purpose of preventing the silane from reacting before reaching the glass surface. Likewise, examples of aluminum materials for depositing aluminum oxide suitable for the undercoating film include trimethylaluminum, aluminum triisopropoxide, diethylaluminum chloride, aluminum acetylacetonate, and aluminum chloride. Examples of the oxidizing materials in this case include oxygen, water vapor, and dry air.

Figure 1:
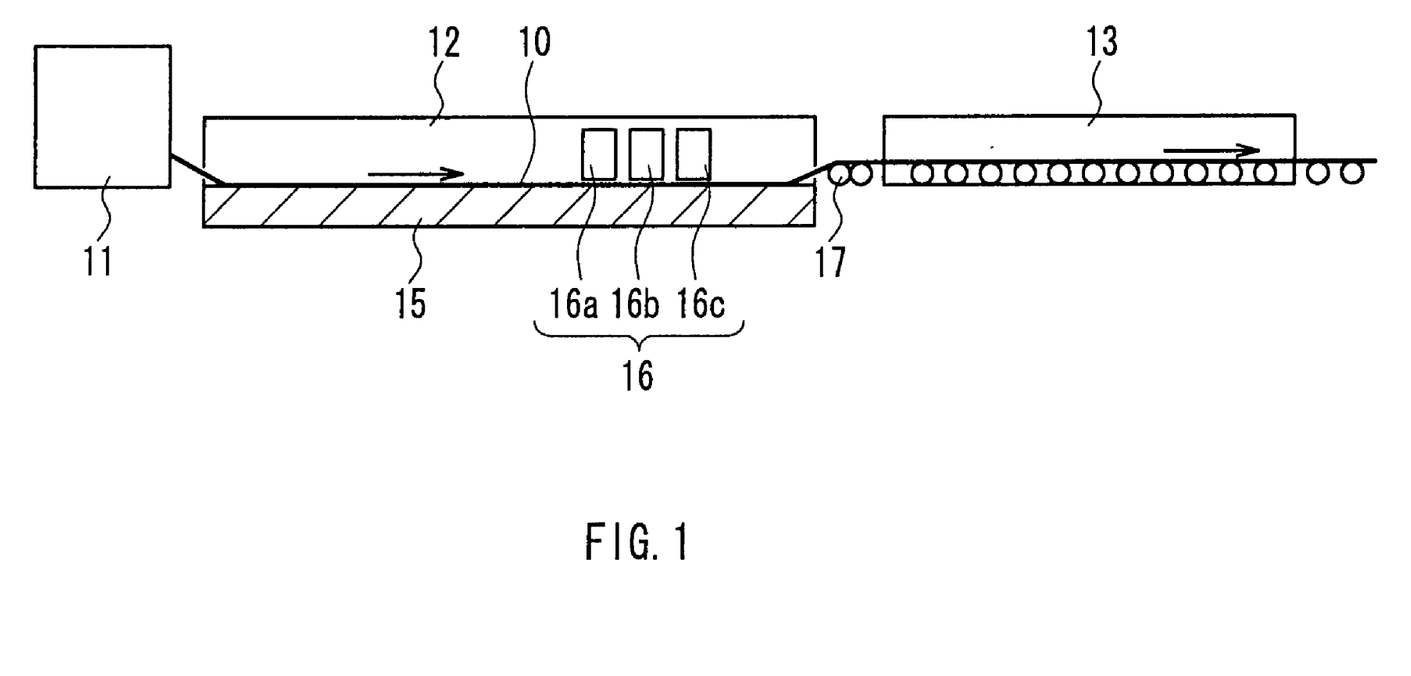
FIG. 1 is a schematic view of an apparatus used for an online CVD (Chemical Vapor Deposition) method.

Hereinbelow, a preferred embodiment with an online CVD method is described in more detail. As illustrated in FIG. 1, in an apparatus used for the online CVD method, a glass ribbon 10 flows out from a melting furnace (float furnace) 11 into a float bath 12 and moves on a tin bath 15 in a belt-like form, and a predetermined number of coaters 16 (three coaters 16a, 16b, and 16c in the embodiment illustrated in the figure) are disposed in the tin float bath so that they are spaced apart from the surface of the glass ribbon. From these coaters, gaseous raw materials are supplied so that the undercoating film, the metal-containing thin film, and the thin film containing a crystalline metal oxide as the main component are formed successively on the glass ribbon 10. Although not shown in the figure, it is possible to provide more coaters so that the undercoating film may include two layers, or the thin film containing a crystalline metal oxide as the main component may be formed by supplying raw materials from a plurality of coaters. The glass ribbon 10 on which the thin film containing a crystalline metal oxide as the main component is formed is pulled up by rollers 17 and is transferred to an annealing furnace 13. The glass ribbon that has been annealed in the annealing furnace 13 is cut into glass sheets having a predetermined size by a cutting device, which is not shown in the figure. For the formation of the thin film containing a metal oxide as the main component, it is possible to use a spraying method for the glass ribbon that has come out of the float bath 12 in combination with the CVD method in the float bath.

With the thin film-forming method according to this invention, in an online CVD method too, even when the thin film containing a metal oxide as the main component is formed on a substrate by a thermal decomposition method using a mixed gas stream containing a metal chloride, an oxidizing material, and hydrogen chloride at a film deposition rate of 4500 nm/min. or greater for a long time continuously, the pipe through which the mixed gas stream passes is not clogged up. In addition, the use of the above-noted mixed gas stream has many advantages in terms of industrial manufacturing process such as temperature controls are made simple until they are supplied to the coaters.

Figure 2:
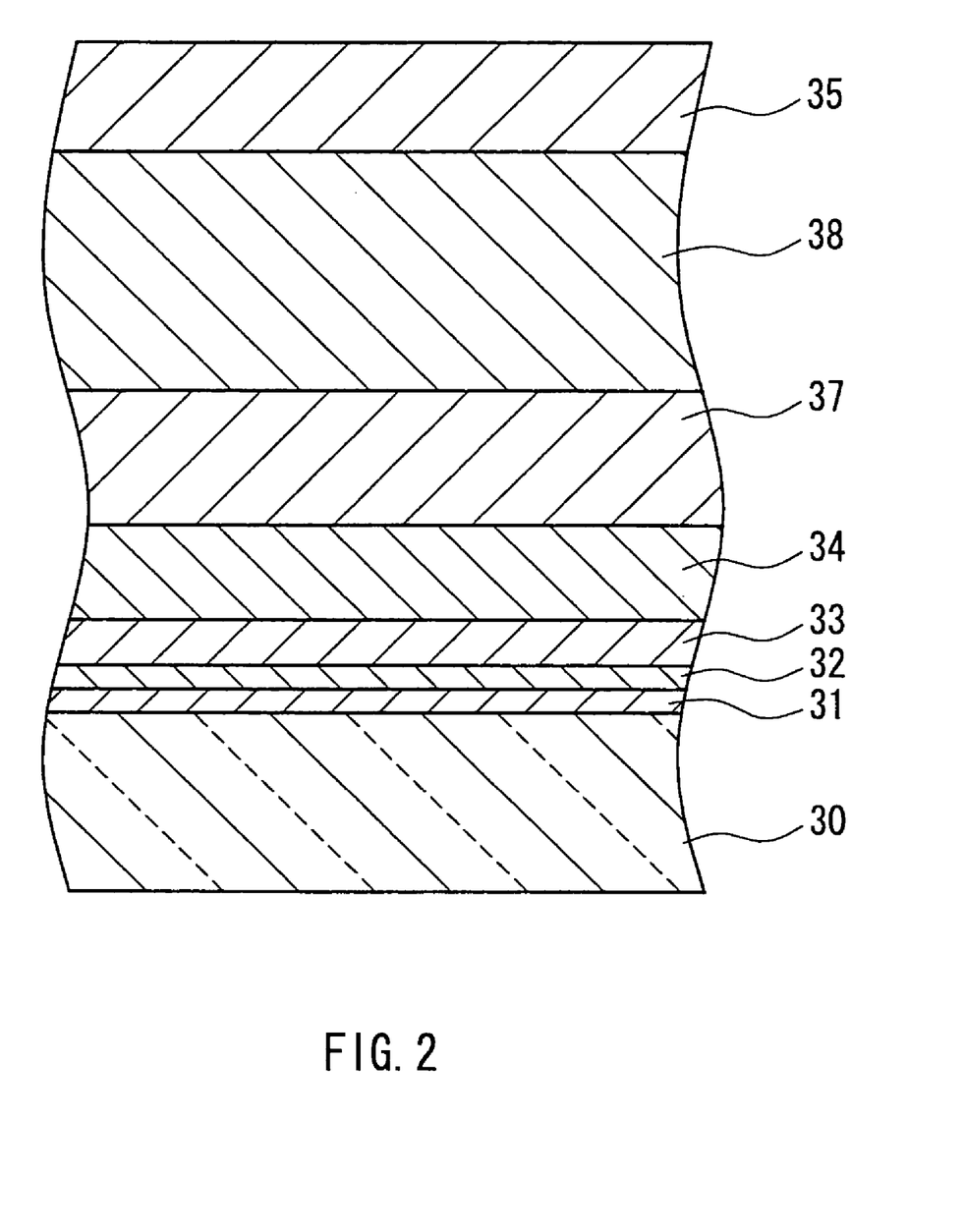
FIG. 2 is a cross-sectional view of one example of a photoelectric conversion device to which this invention is applied.

Hereinbelow, an example of a photoelectric conversion element employing a substrate provided with the buffer layer and the transparent conductive film is described with reference to FIG. 2. The photoelectric conversion element is obtained by forming, on a substrate 30, undercoating films 31 and 32 if necessary, a buffer layer 33, a thin film containing a metal oxide as the main component (transparent conductive film) 34, photoelectric conversion layers 37 and 38, which are thin films composed of amorphous silicon or crystalline silicon or similar films, and a conductive film (back electrode) 35 successively. A device in which the photoelectric conversion element is incorporated and various components are associated and assembled into an unit so that, for example, as a solar cell, electric energy can be taken out from light energy, is referred to as a photoelectric conversion device.

The photoelectric conversion layer may be a single layer, or a plurality of layers may be stacked. It may be a thin film composed of conventional amorphous silicon, or may be a thin film composed of crystalline silicon. Further, a thin film 37 composed of amorphous silicon and a thin film 38 composed of crystalline silicon are combined to form a so-called tandem type. In the case of tandem type, generally, a thin film composed of amorphous silicon is formed on the transparent conductive film, and a thin film composed of crystalline silicon is formed thereover.

The thin film composed of amorphous silicon is formed by depositing p-, i-, and n-type semiconductor layers in that order by a plasma CVD method. Specifically, examples include a film in which the following layers are deposited in that order: a p-type microcrystalline silicon-based layer doped with boron atoms, which are conductivity-determining impurity atoms, at 0.01 atom % or more; an intrinsic non-crystalline silicon layer, serving as a photoelectric conversion layer; and an n-type microcrystalline silicon-based layer doped with phosphorus atoms, which are conductivity-determining impurity atoms, at 0.01% or more. Nevertheless, these respective layers are not limited to the foregoing, and for example, it is possible to use a non-crystalline silicon-based layer for the p-type layer, or to use aluminum as the impurity atoms in the p-type microcrystalline silicon-based layer. Further, alloy materials of non-crystalline or microcrystalline silicon carbide or silicon germanium may be used as the p-type layer. The film thickness of the conductive-type (p-type, n-type) microcrystalline silicon-based layer should preferably be 3 to 100 nm, or more preferably 5 to 50 nm. The film thickness of the intrinsic non-crystalline silicon layer should preferably be 0.05 to 0.5 µm. In a photoelectric conversion element provided with a thin film composed of amorphous silicon, however, it is possible to employ a non-crystalline silicon carbide layer (e.g., a non-crystalline silicon carbide layer composed of non-crystalline silicon containing 10 atom % or less of carbon) or a non-crystalline silicon germanium layer (e.g., a non-crystalline silicon germanium layer composed of non-crystalline silicon containing 30 atom % or less of germanium), which are alloy materials, in place of the intrinsic non-crystalline silicon layer. It is preferable that the intrinsic non-crystalline silicon layer be deposited at a substrate temperature of 450° C. with a plasma CVD method. This layer is formed to be a thin film that is substantially intrinsic semiconductor, the density of the conductivity-type-determining impurity atoms of which is $1 \times 10^{18}$ cm$^{-3}$ or less.

The thin film composed of crystalline silicon can be formed by depositing p-, i-, and n-type semiconductor layers in that order by a plasma CVD method in a similar procedure to that for the foregoing thin film composed of amorphous silicon. Alternatively, it can be formed by electron beam vapor deposition using silicon as a raw material, a plasma CVD method that utilizes glow discharge and uses monosilane diluted with a hydrogen gas as a raw material, or a thermal CVD method using monosilane or dichlorosilane. It is preferable that the film thickness of the thin film composed of crystalline silicon be 0.1 to 10 µm, and particularly preferably 5 µm or less. This thin film is formed at, for example, a low temperature of 450° C. with the plasma CVD method and therefore contains a relatively large number of hydrogen atoms for terminating or inactivating grain boundaries and defects in the grains. The hydrogen content in the layer is preferably in a range of 0.5 to 30 atom %, and particularly preferably in a range of 1 to 20 atom %.

In the case of tandem-type photoelectric conversion element, the thickness of thin film composed of amorphous silicon is preferably 0.05 to 0.4 µm, and the thickness of the thin film composed of crystalline silicon is preferably 0.5 to 5 µm, although they may depend on the configuration of the photoelectric conversion device. For reference, the spectral sensitivity characteristic of the thin film composed of amorphous silicon becomes greatest in a wavelength range of about 500 to 600 nm, and it shows the sensitivity only in a wavelength range up to about 800 nm due to the optical energy gap. On the other hand, the thin film composed of crystalline silicon shows the sensitivity up to about 1100 nm.

For the back electrode, it is preferable to form at least one layer of a metallic layer composed of at least one material selected from aluminum (Al), silver (Ag), gold (Au), copper (Cu), platinum (Pt), and chromium (Cr) by a sputtering method or a vapor deposition method. Further, it is possible to form a layer composed of conductive oxide such as ITO, tin oxide, or zinc oxide between the photoelectric conversion layer and the back electrode.

The photoelectric conversion element provided with the thin film composed of crystalline silicon generates a lower open-end voltage and a higher short circuit current density than that provided with the thin film composed of amorphous silicon. For that reason, in a photoelectric conversion device provided with the thin film composed of crystalline silicon, the transmissivity of the transparent conductive film has more influence on its photoelectric conversion efficiency than the sheet resistance value thereof.

EXAMPLES

Hereinbelow, this invention is described in detail with reference to examples. It should be understood, however, that the invention is not intended to be limited by the following examples.

Example 1

A 1-mm thick aluminosilicate glass sheet cut into a size of 150×150 mm was placed on a mesh belt and passed through a heating furnace to be heated to about 660° C. While transferring the heated glass sheet further, a mixed gas composed of tin tetrachloride (vapor), water vapor, hydrogen chloride, and nitrogen was supplied from a coater installed above the transfer line so as to form, on the glass, a thin film (buffer layer) having a film thickness of 110 nm and composed of tin oxide ($SnO_2$) at a film deposition rate of 2210 nm/min. A plurality of such glasses for which the process was completed up to the buffer layer were prepared. After annealing the glass sheet, it was again placed on the mesh belt and was passed through the heating furnace to be heated to about 660° C. The heated glass sheet was further transferred, and a mixed gas composed of 2.1 mol % tin tetrachloride (vapor), 62.3 mol % water vapor, 0.1 mol % hydrogen chloride, nitrogen, and hydrogen fluoride was supplied from a coater installed above the transfer line onto the buffer layer to form a transparent conductive film (thin film containing a metal oxide as the main component) having a film thickness of 1740 nm and composed of fluorine-containing tin oxide ($SnO_2$:F) at a film deposition rate of 6480 nm/min. Hydrogen chloride was supplied by mixing it, in advance, with water vapor that had not yet been mixed with tin tetrachloride. The mole ratio of hydrogen chloride to tin tetrachloride was 0.05. The gap between the coaters and the glass sheet was set at 10 mm, and further, a nitrogen gas was supplied beside the exhaust section in a curtain-like fashion so that the outside air did not intrude inside the coater during the formation of the transparent conductive film.

This glass sheet had a haze ratio (haze factor) of 19% but showed no white turbidity.

In addition, the mixed gas composed of tin tetrachloride (vapor), water vapor, hydrogen chloride, nitrogen, and hydrogen fluoride was supplied from the coater for about 3 hours continuously. The glasses for which the process was completed up to the buffer layer were transferred from time to time to confirm the film deposition rate and the characteristics of the transparent conductive film; the result was that the film thickness of the transparent conductive film remained almost unchanged, that the film deposition rate did not decrease, and that the haze ratio changed only in a range of 19 to 22%. After the supply of the mixed gas for about 3 hours, the pipe through which the mixed gas stream was passed through was observed, but neither adhering substance nor clogged spot was observed in the pipe.

Example 2

A buffer layer was formed on a glass prepared in a similar manner to Example 1, under the same conditions as those in Example 1. This glass sheet again was placed on the mesh belt and was passed through the heating furnace to be heated to about 660° C. While transferring the heated glass sheet further, a mixed gas composed of 2.6 mol % tin tetrachloride (vapor), 79.9 mol % water vapor, 0.79 mol % hydrogen chloride, nitrogen, and hydrogen fluoride was supplied from a coater installed above the transfer line to form on the buffer layer a transparent conductive film (thin film containing a crystalline metal oxide as the main component) having a film thickness of 1700 nm and composed of fluorine-containing tin oxide ($SnO_2$:F) at a film deposition rate of 11400 nm/min. Hydrogen chloride was supplied by mixing it, in advance, with water vapor that had not yet been mixed with tin tetrachloride. The mole ratio of hydrogen chloride to tin tetrachloride was 0.3. The gap between the coaters and the glass sheet was set at 10 mm, and a nitrogen gas was supplied beside the exhaust section in a curtain-like fashion so that the outside air does not intrude inside the coater during the formation of the transparent conductive film.

This glass sheet had a haze ratio of 20% but showed no white turbidity.

In a similar manner to Example 1, the mixed gas used for forming the transparent conductive film was supplied from the coater for about 3 hours continuously. The glasses for which the process was completed up to the buffer layer were transferred from time to time to confirm the film deposition rate and the characteristics of the transparent conductive film; the result was that the film thickness of the transparent conductive film remained almost unchanged, that the film deposition rate did not decrease, and that the haze ratio of the transparent electric film changed only in a range of 17 to 22%. After the supply of the mixed gas for about 3 hours, the pipe was observed, but neither adhering substance nor clogged spot was observed in the pipe.

Example 3

A buffer layer was formed on a glass prepared in a similar manner to Example 1, under the same conditions as those in Example 1. This glass sheet was again placed on the mesh belt and was passed through the heating furnace to be heated to about 660° C. While transferring the heated glass sheet further, a mixed gas composed of 2.6 mol % tin tetrachloride (vapor), 80.1 mol % water vapor, 0.53 mol % hydrogen chloride, nitrogen, and hydrogen fluoride was supplied from a coater installed above the transfer line to form on the buffer layer a transparent conductive film (thin film containing a metal oxide as the main component) having a film thickness of 1650 nm and composed of fluorine-containing tin oxide ($SnO_2$:F) at a film deposition rate of 10800 nm/min.

Hydrogen chloride was supplied by mixing it, in advance, with water vapor that had not yet been mixed with tin tetrachloride. The mole ratio of hydrogen chloride to tin tetrachloride was 0.2. The gap between the coater and the glass sheet was set at 10 mm, and a nitrogen gas was supplied beside the exhaust section in a curtain-like fashion so that the outside air does not intrude inside the coater during the formation of the transparent conductive film.

This glass sheet had a haze ratio of 17% but showed no white turbidity.

In a similar manner to Example 1, the mixed gas used for forming the transparent conductive film was supplied from the coater for about 3 hours continuously. The glasses for which the process was completed up to the buffer layer were transferred from time to time to confirm the film deposition rate and the characteristics of the transparent conductive film; the result was that the film thickness of the transparent conductive film remained almost unchanged, that the film deposition rate did not decrease, and that the haze ratio varied only in a range of 15 to 20%. After the supply of the mixed gas for about 3 hours, the pipe was observed, but neither adhering substance nor clogged spot was observed in the pipe.

Example 4

A buffer layer was formed on a glass prepared in a similar manner to Example 1, under the same conditions as those in Example 1. This glass sheet was again placed on the mesh belt and was passed through the heating furnace to be heated to about 660° C. While transferring the heated glass sheet further, a mixed gas composed of 3.0 mol % tin tetrachloride (vapor), 76.8 mol % water vapor, 0.60 mol % hydrogen chloride, nitrogen, and hydrogen fluoride was supplied from a coater installed above the transfer line to form on the buffer layer a transparent conductive film (thin film containing a metal oxide as the main component) having a film thickness of 2170 nm and composed of fluorine-containing tin oxide ($SnO_2$:F) at a film deposition rate of 11700 nm/min.

Hydrogen chloride was supplied by mixing it, in advance, with water vapor that had not yet been mixed with tin tetrachloride. The mole ratio of hydrogen chloride to tin tetrachloride was 0.2. The gap between the coater and the glass sheet was set at 10 mm, and a nitrogen gas was supplied beside the exhaust section in a curtain-like fashion so that the outside air does not intrude inside the coater during the formation of the transparent conductive film.

This glass sheet had a haze ratio of 21% but showed no white turbidity.

In a similar manner to Example 1, the mixed gas used for forming the transparent conductive film was supplied from the coater for about 3 hours continuously. The glasses for which the process was completed up to the buffer layer were transferred from time to time to confirm the film deposition rate and the characteristics of the transparent conductive film; the result was that the film thickness of the transparent conductive film remained almost unchanged, that the film deposition rate did not decrease, and that the haze ratio varied only in a range of 20 to 25%. After the supply of the mixed gas for about 3 hours, the pipe was observed, but neither adhering substance nor clogged spot was observed in the pipe.

Example 5

An undercoating film, a buffer layer, and a transparent conductive film were formed on a glass ribbon in that order utilizing an online CVD method. Specifically, 98 volume % of nitrogen and 2 volume % of hydrogen were supplied inside the space of a float bath so that the inside of the float bath is kept at a slightly higher pressure than that outside the bath. With the inside of the float bath being kept to be a non-oxidizing atmosphere, a mixed gas composed of tin tetrachloride (vapor), water vapor, hydrogen chloride, nitrogen, and helium was supplied from a first coater located on the most upstream side to form a thin film (first undercoating layer) having a thickness of 55 nm and composed of tin oxide on the glass ribbon. Subsequently, a mixed gas composed of monosilane, ethylene, oxygen, and nitrogen was supplied from a second coater to form a thin film (second undercoating layer) having a thickness of 30 nm and composed of silicon oxide on the first undercoating layer. Further, a mixed gas composed of 0.53 mol % tin tetrachloride (vapor), 42.4 mol % water vapor, 0.03 mol % hydrogen chloride, and nitrogen was supplied from a third coater to form a thin film (buffer layer) having a thickness of 90 nm and composed of tin oxide ($SnO_2$) on the second undercoating layer having a surface temperature 680° C. at a film deposition rate of 1830 nm/min. Using a coater installed on the further downstream side, a mixed gas composed of 3.4 mol % tin tetrachloride (vapor), 51.6 mol % water vapor, 0.18 mol % hydrogen chloride was supplied onto the buffer layer having a surface temperature of 630° C. to form a transparent conductive film (thin film containing a metal oxide as the main component) having a film thickness of 705 nm and composed of fluorine-containing tin oxide ($SnO_2$:F) at a film deposition rate of 6980 nm/min.

This glass sheet had a haze ratio of 16% and showed no white turbidity.

Hydrogen chloride was supplied by mixing it, in advance, with water vapor that had not yet been mixed with tin tetrachloride. The mole ratio of hydrogen chloride to tin tetrachloride was 0.05.

Using a thin film-forming apparatus according to this online CVD method, the mixed gas used for forming the transparent conductive film was supplied from the coater for about 4 hours continuously to confirm the film deposition rate and the characteristics of the transparent conductive film. The result was that the thickness of the transparent conductive film remained almost unchanged, the film deposition rate did not decrease, and the haze ratio of the transparent conductive film varied only in a range of 14 to 20%. When the pipe was observed after the supply of the mixed gas for about 4 hours, a little adhering substance was observed but no clogged spot was found in the pipe.

Example 6

An undercoating film, a buffer layer, and a transparent conductive film were formed on a glass ribbon in that order utilizing an online CVD method. Specifically, 98 volume % of nitrogen and 2 volume % of hydrogen were supplied inside the space of a float bath so that the inside of the float bath is kept at a slightly higher pressure than that outside the bath. With the inside of the float bath being kept as a non-oxidizing atmosphere, a mixed gas composed of tin tetrachloride (vapor), water vapor, hydrogen chloride, nitrogen, and helium was supplied from a first coater located on the most upstream side to form a thin film (first undercoating layer) having a thickness of 55 nm and composed of tin oxide on the glass ribbon. Subsequently, a mixed gas composed of monosilane, ethylene, oxygen, and nitrogen was supplied from a second coater to form a thin film (second undercoating layer) having a thickness of 30 nm and composed of silicon oxide on the first undercoating layer. Further, a mixed gas composed of 1.20 mol % tin tetrachloride (vapor), 36.2 mol % water vapor, 0.06 mol % hydrogen chloride, and nitrogen was supplied from a third coater to form a thin film (buffer layer) having a thickness of 170 nm and composed of tin oxide ($SnO_2$) on the second undercoating layer having a surface temperature 680° C. at a film deposition rate of 3365 nm/min. Using a coater installed on the further downstream side, a mixed gas composed of 3.4 mol % tin tetrachloride (vapor), 51.6 mol % water vapor, 0.18 mol % hydrogen chloride, nitrogen, and hydrogen fluoride was supplied onto the buffer layer having a surface temperature of 630° C. to form a transparent conductive film (thin film containing a metal oxide as the main component) having a film thickness of 675 nm and composed of fluorine-containing tin oxide ($SnO_2$:F) at a film deposition rate of 6677 nm/min.

This glass sheet had a haze ratio of 22% and showed no white turbidity.

Hydrogen chloride was supplied by mixing it, in advance, with water vapor that had not yet been mixed with tin tetrachloride. The mole ratio of hydrogen chloride to tin tetrachloride was 0.05.

In a similar manner to Example 5, the mixed gas used for forming the transparent conductive film was supplied from the coater for about 4 hours continuously to confirm the film deposition rate and the characteristics of the transparent conductive film. The result was that the thickness of the transparent conductive film remained almost unchanged, the film deposition rate did not decrease, and the haze ratio of the transparent conductive film varied only in a range of 18 to 23%. When the pipe was observed after the supply of the mixed gas for about 4 hours, a little adhering substance was observed but no clogged spot was found in the pipe.

Example 7

A buffer layer and a transparent conductive film were formed on a glass ribbon in that order utilizing an online CVD method. Specifically, 98 volume % of nitrogen and 2 volume % of hydrogen were supplied inside the space of a float bath so that the inside of the float bath is kept at a slightly higher pressure than that outside the bath. With the inside of the float bath being kept as a non-oxidizing atmosphere, a mixed gas composed of 1.32 mol % tin tetrachloride (vapor), 39.4 mol % water vapor, 0.07 mol % hydrogen chloride, and nitrogen was supplied from a first coater located on the most upstream side to form a thin film (buffer layer) having a thickness of 140 nm and composed of tin oxide ($SnO_2$) on the glass ribbon having a surface temperature 680° C. at a film deposition rate of 2771 nm/min. Using a coater installed on the further downstream side, a mixed gas composed of 2.7 mol % tin tetrachloride (vapor), 80.6 mol % water vapor, 0.54 mol % hydrogen chloride, nitrogen, and hydrogen fluoride was supplied onto the buffer layer having a surface temperature of 630° C. to form a transparent conductive film (thin film containing a metal oxide as the main component) having a film thickness of 798 nm and composed of fluorine-containing tin oxide ($SnO_2$:F) at a film deposition rate of 5423 nm/min.

This glass sheet had a haze ratio of 20% and showed no white turbidity.

Hydrogen chloride was supplied by mixing it, in advance, with water vapor that had not yet been mixed with tin tetrachloride. The mole ratio of hydrogen chloride to tin tetrachloride was 0.2.

In a similar manner to Example 5, the mixed gas used for forming the transparent conductive film was supplied from the coater for about 4 hours continuously to confirm the film deposition rate and the characteristics of the transparent conductive film; the result was that the thickness of the transparent conductive film remained almost unchanged, the film deposition rate did not decrease, and the haze ratio of the transparent conductive film varied only in a range of 16 to 32%. When the pipe was observed after the supply of the mixed gas for about 4 hours, a little adhering substance was observed but no clogged spot was found in the pipe.

Comparative Example 1

A transparent conductive film was formed under the same conditions as in Example 5 except that the mixed gas was supplied without mixing hydrogen chloride therein. The formation within a short time resulted in a transparent conductive film having a surface roughness that is somewhat large and has variations, due to a slightly larger film thickness than that of Example 5. Also, when the mixed gas was supplied for 3 hours continuously, the pressure in the pipe increased and the supply of the mixed gas became impossible. At this time, the pipe for the mixed gas was disassembled to observe the inside, and consequently, it was confirmed that a white, adhering substance was formed inside the pipe and that the pipe was almost in a clogged state.

Comparative Example 2

A transparent conductive film was formed in a similar manner to Example 2 except that the following points were changed. Taking Example D of JP 9(1997)-40442 A as a reference, the mole ratio of hydrogen chloride to tin tetrachloride was increased to 1.1. As a result, it was confirmed that the thickness of the transparent conductive film excluding the buffer layer was 200 nm and the film deposition rate was reduced to about ⅓, that is, 2030 nm/min.

Manufacturing Example 1

Thin films having a thickness of 0.3 μm and composed of amorphous silicon were formed on the respective transparent conductive films formed according to Example 1 and Comparative Example 1 by a plasma CVD method using monosilane and hydrogen as raw materials. Thereafter, a silver thin film (back electrode) having a thickness of 300 nm was formed by a sputtering method, and thus, samples of a photoelectric conversion element were fabricated. These samples are configured in accordance with a general configuration of a solar cell that uses a thin film composed of amorphous silicon as the photoelectric conversion layer. For these samples, their photoelectric conversion efficiency was measured by a known technique. The result was that the conversion efficiency of Example 1 was 9.4%, and that the conversion efficiency of comparative Example 1 was 8.65%.

According to this invention, a thin film containing a metal oxide as the main component can be formed at a high film deposition rate over a long time. Furthermore, a high quality thin film containing a metal oxide as the main component can be attained, and utilizing this, a photoelectric conversion device with a high conversion efficiency can be obtained.

The invention claimed is:

1. A method of forming a thin film containing a metal oxide as a main component on a substrate using a mixed gas stream containing a metal chloride, an oxidizing material, and hydrogen chloride by a thermal decomposition method at a film deposition rate of 4500 nm/min. or greater, the method characterized by performing at least one selected from:

1) prior to mixing the metal chloride and the oxidizing material in the mixed gas stream, contacting the hydrogen chloride with at least one selected from the metal chloride and the oxidizing material; and 2) forming a buffer layer in advance on a surface of the substrate on which the thin film containing a metal oxide as the main component is to be formed.

2. The method of forming a thin film according to claim 1, wherein the mole ratio of the hydrogen chloride to the metal chloride is less than 1 in the mixed gas stream.

3. The method of forming a thin film according to claim 1, wherein the film deposition rate is 6300 nm/min. or greater.

4. The method of forming a thin film according to claim 1, wherein the mole ratio of the hydrogen chloride to the metal chloride is 0.2 or lower in the mixed gas stream.

5. The method of forming a thin film according to claim 1, wherein the metal chloride is tetrachloride.

6. The method of forming a thin film according to claim 1, wherein the buffer layer is fine metallic particles adhered onto the substrate, or a thin film formed at a film deposition rate slower that the film deposition rate for the thin film containing a metal oxide as the main component.

7. The method of forming a thin film according to claim 1, wherein the substrate is a glass ribbon in a float process, and the thin film containing a metal oxide as the main component is formed in a float bath.

* * * * *